United States Patent
Civay et al.

(10) Patent No.: US 9,275,896 B2
(45) Date of Patent: Mar. 1, 2016

(54) METHODS FOR FABRICATING INTEGRATED CIRCUITS USING DIRECTED SELF-ASSEMBLY

(71) Applicant: GLOBALFOUNDRIES, Inc., Grand Cayman (KY)

(72) Inventors: Deniz Elizabeth Civay, Clifton Park, NY (US); Ji Xu, Watervliet, NY (US); Gerard Schmid, Guilford, CT (US); Guillaume Bouche, Albany, NY (US); Richard A. Farrell, Albany, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/341,985

(22) Filed: Jul. 28, 2014

(65) Prior Publication Data

US 2016/0027685 A1    Jan. 28, 2016

(51) Int. Cl.
*H01L 21/033* (2006.01)
*H01L 21/768* (2006.01)
*H01L 21/02* (2006.01)
*H01L 21/311* (2006.01)
*H01L 21/027* (2006.01)

(52) U.S. Cl.
CPC ...... *H01L 21/76802* (2013.01); *H01L 21/0271* (2013.01); *H01L 21/02118* (2013.01); *H01L 21/31133* (2013.01); *H01L 21/31144* (2013.01); *H01L 21/76879* (2013.01); *H01L 21/76897* (2013.01)

(58) Field of Classification Search
None
See application file for complete search history.

(56) References Cited

U.S. PATENT DOCUMENTS

| | | | |
|---|---|---|---|
| 7,964,107 B2 * | 6/2011 | Millward | 216/17 |
| 8,853,085 B1 * | 10/2014 | Abdallah et al. | 438/694 |
| 2009/0035668 A1 * | 2/2009 | Breyta et al. | 430/18 |
| 2011/0076623 A1 | 3/2011 | Fitrianto | |
| 2011/0147984 A1 * | 6/2011 | Cheng et al. | 264/220 |
| 2012/0207940 A1 * | 8/2012 | Muramatsu et al. | 427/510 |
| 2012/0331428 A1 * | 12/2012 | Cheng et al. | 716/52 |
| 2014/0091476 A1 * | 4/2014 | Nyhus et al. | 257/774 |
| 2014/0154630 A1 * | 6/2014 | Schmid et al. | 430/323 |
| 2014/0245948 A1 * | 9/2014 | Nguyen et al. | 117/200 |

* cited by examiner

*Primary Examiner* — Michael Lebentritt
*Assistant Examiner* — Jordan Klein
(74) *Attorney, Agent, or Firm* — Ingrassia Fisher & Lorenz, P.C.

(57) ABSTRACT

Methods for fabricating integrated circuits are provided. In one example, a method for fabricating an integrated circuit includes forming a graphoepitaxy DSA directing confinement well using a sidewall of an etch layer that overlies a semiconductor substrate. The graphoepitaxy DSA directing confinement well is filled with a block copolymer. The block copolymer is phase separated into an etchable phase and an etch resistant phase. The etchable phase is etched while leaving the etch resistant phase substantially in place to define an etch mask with a nanopattern. The nanopattern is transferred to the etch layer.

13 Claims, 6 Drawing Sheets

METHODS FOR FABRICATING INTEGRATED CIRCUITS USING DIRECTED SELF-ASSEMBLY

TECHNICAL FIELD

The technical field relates generally to methods for fabricating integrated circuits, and more particularly relates to methods for fabricating integrated circuits using graphoepitaxy confinement wells for directed self-assembly.

BACKGROUND

Decreasing device size and increasing device density has traditionally been a high priority for the manufacturing of integrated circuits. Optical lithography has been the driving force for device scaling. Conventional optical lithography is limited to about 80 nm pitch for single exposure patterning. While double and other multi-patterning processes can realize smaller pitch, these approaches are expensive and more complex.

Directed self-assembly (DSA), a technique which aligns self-assembling polymeric materials on a lithographically defined guide pattern, is a potential option for extending current optical lithography beyond its pitch and resolution limits. The self-assembling materials, for example, are block copolymers (BCPs) that consist of "A" homopolymer(s) covalently attached to "B" homopolymer(s), which are coated over a lithographically defined guide pattern on a semiconductor substrate. The lithographically defined guide pattern is a pre-pattern that is encoded with spatial chemical and/or topographical information and serves to direct the self-assembly process and the pattern formed by the self-assembling materials. Subsequently, by annealing the DSA polymers, the A polymer chains and the B polymer chains undergo phase separation to form an A polymer region and a B polymer region that are registered to the guide pattern. Then, by removing either the A polymer region or the B polymer region by wet chemical or plasma-etch techniques, a pattern is formed for transferring to the underlying substrate.

One approach of DSA is graphoepitaxy in which self-assembly is directed by topographical features that are formed overlying a semiconductor substrate. This technique is used, for example, to create contact holes or vias that can be subsequently filled with conductive material for forming electrical connections between two or more layers of the semiconductor substrate. In particular, the topographical features are formed overlying the semiconductor substrate using one or more photomasks that define mask features and conventional lithographic techniques to transfer the mask features to a photoresist layer that overlies the semiconductor substrate to form a patterned photoresist layer. The patterned photoresist layer is then selectively etched to form the topographical features as guide patterns that are configured as confinement wells. The confinement wells are filled with a BCP that is subsequently phase separated to form, for example, etchable cylinders or other etchable features that are each formed of either the A polymer region or the B polymer region of the BCP. The etchable cylinders, or other etchable features, are removed to form openings and define a pattern for etch transferring the openings to the underlying semiconductor substrate.

Unfortunately, current techniques for forming defining the layers within a microchip (contact(s), gate(s), fin(s), etc.) require a significant number of photomasks/photolayers, multiple exposures for lithography (i.e., LELELE), etch steps, wet clean steps, and deposition steps. As such, there is considerable cost and complexity associated with patterning each individual layer, directed self-assembly is considered a promising technology due to its ability to decrease cost and complexity and possibly eliminate additional photomask/photolayer steps.

Accordingly, it is desirable to provide methods for fabricating integrated circuits that may reduce, minimize, or eliminate the use of photomasks and/or simplify the lithographical process steps for forming graphoepitaxy DSA patterns. Furthermore, other desirable features and characteristics of the present invention will become apparent from the subsequent detailed description and the appended claims, taken in conjunction with the accompanying drawings and this background.

BRIEF SUMMARY

Methods for fabricating integrated circuits are provided herein. In accordance with an exemplary embodiment, a method for fabricating an integrated circuit includes forming a graphoepitaxy DSA directing confinement well using a sidewall of an etch layer that overlies a semiconductor substrate. The graphoepitaxy DSA directing confinement well is filled with a block copolymer. The block copolymer is phase separated into an etchable phase and an etch resistant phase. The etchable phase is etched while leaving the etch resistant phase substantially in place to define an etch mask with a nanopattern. The nanopattern is transferred to the etch layer.

In accordance with another exemplary embodiment, a method for fabricating an integrated circuit is provided. The method includes conformally depositing an etch layer overlying a semiconductor substrate and a device feature that has a topography to form the etch layer with a sidewall. The sidewall at least in part defines a graphoepitaxy DSA directing confinement well. A block copolymer is deposited in the graphoepitaxy DSA directing confinement well. The block copolymer is phase separated and etched to define a nanopattern. The nanopattern is transferred to the etch layer.

In accordance with another exemplary embodiment, a method for fabricating an integrated circuit is provided. The method includes depositing an etch layer overlying a semiconductor substrate. A sidewall is etched in the etch layer to define at least in part a graphoepitaxy DSA directing confinement well. A block copolymer is deposited in the graphoepitaxy DSA directing confinement well. The block copolymer is phase separated and etched to define a nanopattern. The nanopattern is transferred to the etch layer.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to methods for fabricating integrated circuits (ICs). The exemplary embodiments taught herein form a graphoepitaxy DSA directing confinement well as a guide pattern for directed self-assembly (DSA) using an area(s) of the IC that has a non-planar topography, for example, that is defined by a device feature(s) positioned at or near the particular area(s), or alternatively, that may be formed by etching into an etchable layer of the IC. In particular, a sidewall of an etch layer that overlies a semiconductor substrate forms at least in part the graphoepitaxy DSA directing confinement well. In an exemplary embodiment, the sidewall of the etch layer may be formed by conformally depositing the etch layer overlying a device feature that has a topography and that is formed into or disposed on or over the semiconductor layer. In another exemplary embodiment, the sidewall of the etch layer is formed by depositing the etch layer, such as an interlayer dielectric (ILD) layer of dielectric material, and etching the sidewall into the etch layer.

The graphoepitaxy DSA directing confinement well is then filled with a block copolymer by spin, spray, and/or plasma deposition coating techniques. The block copolymer is phase separated into an etchable phase and an etch resistant phase. The etchable phase is etched while leaving the etch resistant phase substantially in place to define an etch mask with a nanopattern. In an exemplary embodiment, the nanopattern is transferred to the etch layer via an etching process using the remaining polymers (i.e., the etch mask). It has been found that by using the existing topography of an area(s) of the IC or by etching the topography into the etch layer of the IC, the use of photomasks and/or the lithographical process steps for forming the graphoepitaxy DSA directing confinement well as a guide pattern for DSA can be reduced, minimized, eliminated and/or simplified relative to traditional graphoepitaxy DSA approaches.

FIGS. 1-15 illustrate methods for fabricating an integrated circuit 10 in accordance with various embodiments. The described process steps, procedures, and materials are to be considered only as exemplary embodiments designed to illustrate to one of ordinary skill in the art methods for practicing the invention; the invention is not limited to these exemplary embodiments. Various steps in the manufacturing of integrated circuits are well known and so, in the interest of brevity, many conventional steps will only be mentioned briefly herein or will be omitted entirely without providing the well-known process details.

Figure 1:
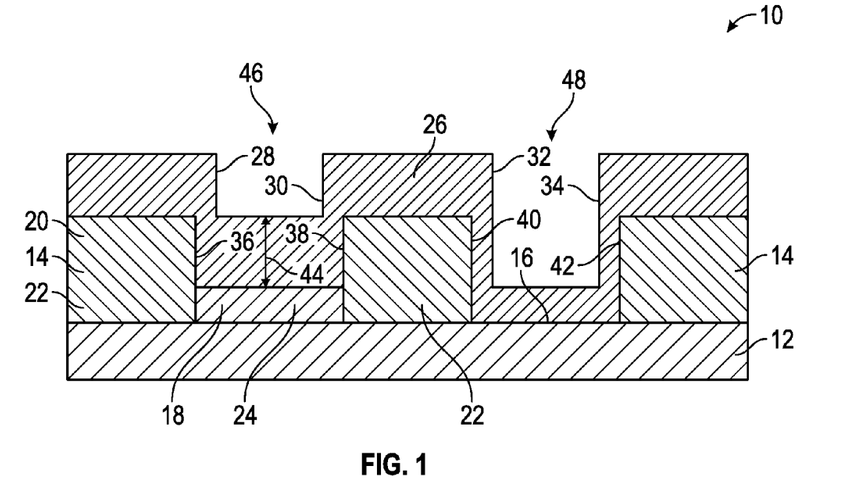
FIGS. 1-15 illustrate, in cross-sectional views, an integrated circuit and methods for fabricating an integrated circuit during various intermediate fabrication stages in accordance with exemplary embodiments.

FIG. 1 illustrates, in cross-sectional view, the integrated circuit 10 during an intermediate fabrication stage in accordance with an exemplary embodiment. The IC 10 includes a semiconductor substrate 12. As used herein, the term 'semiconductor substrate' will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. An exemplary semiconductor material is a silicon substrate. The silicon substrate may be a bulk silicon wafer or may be a thin layer of silicon on an insulating layer (commonly known as silicon-on-insulator or SOI) that, in turn, is supported by a carrier wafer.

In an exemplary embodiment, disposed over, on and/or in the semiconductor substrate 12 are device features 14 that each have a corresponding topography or elevation difference(s) relative to a planar surface 16 of the semiconductor substrate 12. As illustrated, in an exemplary embodiment, one of the device features 14 is configured as field effect transistor (FET) that includes a fin 18 that extends upwardly from the semiconductor substrate 12. Such non-planar FETs are well-known in the art and commonly referred to as a FINFET 20. Although only one of the device features 14 is shown configured as a FINFET, it is to be understood that the device features 14 may both be configured as FINFETs or may independently be configured as any other type of non-planar device feature known to those skilled in the art for ICs, such as, for example, any type of FETs (e.g., metal oxide semiconductor (MOS) FETs that include a gate stacks or otherwise) or the like.

The FINFET 20 can be fabricated as a P-channel transistor or as an N-channel transistor, and can also be fabricated with or without mobility enhancing stress features. A circuit designer can mix and match device types, using P-channel and N-channel, FINFET and other types of MOS transistors, stressed and unstressed, to take advantage of the best characteristics of each device type as they best suit the circuit being designed.

As illustrated, the FINFET 20 includes gate electrodes 22 that overlie the fin 18 and are electrically insulated from the fin 18 by a gate insulator (not illustrated). The fin 18 is appropriately impurity doped to form source and drain regions 24 (only one of at least two regions 24 is illustrated) of the FINFET 20 as is well-known in the art.

The fin 18 is formed according to known processes. For instance, when using a SOI semiconductor substrate as the semiconductor substrate 12, a portion of the top silicon layer of the semiconductor substrate 12 is etched or otherwise removed leaving the fin 18 formed from silicon remaining on an underlying oxide layer (not illustrated). As shown, the gate electrodes 22 are formed across the fin 18. Gate oxide and/or nitride capping layers (not shown) may be deposited over the fin 18 before the gate electrodes 22 are formed. The gate electrodes 22 are formed by typical lithographic processing.

In an exemplary embodiment, an etch layer 26 is conformally deposited overlying the semiconductor substrate and the device features 14. In an exemplary embodiment, the etch layer 26 is formed of an etchable dielectric material, such as silicon dioxide ($SiO_2$), silicon nitride ($Si_3N_4$), silicon oxycarbide ($SiO_xC_y$), or the like. The etch layer 26 may be conformally deposited using known techniques, such as a chemical vapor deposition (CVD) process, atomic layer deposition (ALD), molecular layer deposition (MLD), metal organic chemical vapor deposition (MOCVD), spin coating, or the like.

As illustrated, the etch layer 26 substantially conforms to the topography of the device features 14 forming sidewalls 28, 30, 32 and 34 in the etch layer 26 that correspond to vertical surfaces 36, 38, 40, and 42 of the device features 14, respectively. In an exemplary embodiment and as will be discussed in further detail below, the sidewalls 28 and 30 of the etch layer 26 define a graphoepitaxy DSA directing confinement well 46 and the sidewalls 32 and 34 of the etch layer 26 define a trench 48 that is spaced apart from the graphoepitaxy DSA directing confinement well 46. Although the thickness of the etch layer 26 may vary with the topography of the IC 10 as shown, in an exemplary embodiment, the etch layer 26 has a thickness (indicated by double headed arrow 44) of from about 10 to about 100 nm under the graphoepitaxy DSA directing confinement well 46.

Figure 2:
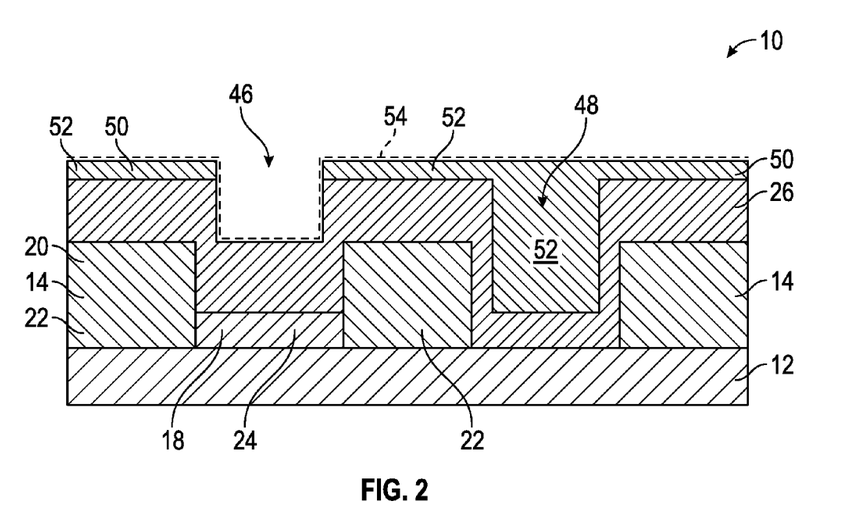

FIG. 2 illustrates, in cross-sectional view, the integrated circuit 10 during a further advanced fabrication stage in accordance with an exemplary embodiment. The method continues by depositing and patterning a photoresist/anti-reflective stack layer 50 overlying the etch layer 26 to form a patterned photoresist/anti-reflective stack layer 52. In an exemplary embodiment, the photoresist/anti-reflective stack layer 50 is deposited to completely cover the etch layer 26 including filling in both the graphoepitaxy DSA directing confinement well 46 and the trench 48. The photoresist/anti-reflective stack layer 50 is then selectively patterned by 193 nm immersion lithography, electron beam lithography, or extreme ultraviolet lithography, for example, to expose the graphoepitaxy DSA directing confinement well 46 while leaving the trench 48 and other areas of the etch layer 26 adjacent to the graphoepitaxy DSA directing confinement well 46 covered by the patterned photoresist/anti-reflective stack layer 52.

In an exemplary embodiment, depending upon the preferential affinity towards the etch layer 26 of the individual polymeric block components of a block copolymer that will be subsequently deposited in the graphoepitaxy DSA directing confinement well 46 as will be discussed in further detail, optionally an orientation control layer 54 (indicated by dashed line) is deposited in the graphoepitaxy DSA directing confinement well 46 and overlying the patterned photoresist/anti-reflective stack layer 52. In an exemplary embodiment, the orientation control layer 54 has some preferential affinity for one of the individual polymeric block components of the subsequently deposited block copolymer. In one example, the orientation control layer 54 forming material is a hydroxylated polystyrene-(random)-polymethylmethacrylate (PS-r-PMMA-OH) copolymer that is dissolved in an organic solvent, such as PGMEA, 4-methyl-2-pentanol, n-butyl acetate, gamma-butyrolactone, toluene, acetone, and/or the like, and is conformally deposited on the IC 10 using a spin coating process. In an exemplary embodiment, after deposition, the orientation control layer 54 forming material is heated to a temperature of from about 100 to about 350° C. to graft the brush-material to the surface and/or cross-link the material. In an exemplary embodiment, the orientation control layer 54 has a thickness of from about 5 to about 10 nm.

Figure 3:
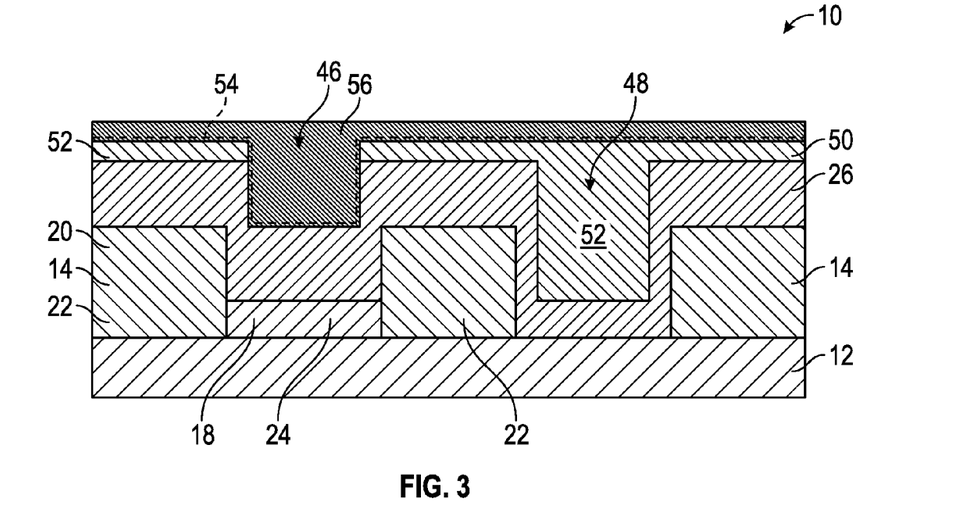

FIGS. 3-6 illustrate, in cross-sectional views, the IC 10 during later fabrication stages in accordance with an exemplary embodiment. The method continues by depositing a block copolymer 56 overlying the patterned photoresist/anti-reflective stack layer 52 and overlying the orientation control layer 54 if present and filling the graphoepitaxy DSA directing confinement well 46. As illustrated in FIG. 3, in an exemplary embodiment, because the trench 48 is filled with the patterned photoresist/anti-reflective stack layer 52 while the graphoepitaxy DSA directing confinement well 46 is exposed, the block copolymer 56 selectively fills the graphoepitaxy DSA directing confinement well 46.

In an exemplary embodiment, the block copolymer 56 has A polymer blocks and B polymer blocks. Non-limiting examples of block copolymers include polystyrene-block-polymethylmethacrylate (PS-b-PMMA), polystyrene-block-polybutadiene (PS-b-PB), polystyrene-block-poly(2-vinyl pyridine) (PS-b-P2VP), polystyrene-block-polydimethylsiloxane (PS-b-PDMS), and polystyrene-block-polyethylene oxide (PS-b-PEO). In an exemplary embodiment, the block copolymer 56 is deposited using a spin coating process or the like.

Figure 4:
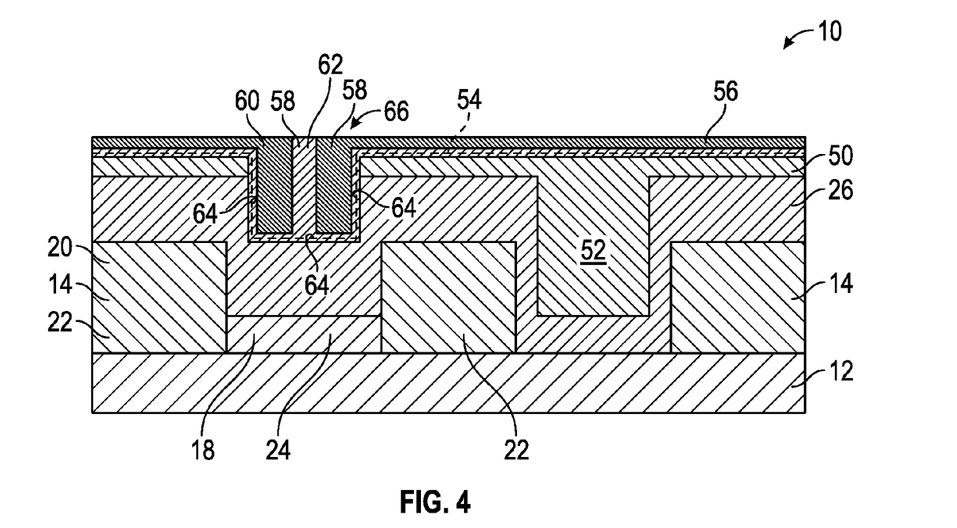

The block copolymer 56 is annealed, for example by either heating the block copolymer 56 at a predetermined temperature for a predetermined time or by solvent annealing such as by applying an organic solvent such as methyl ethyl ketone (MEK), toluene, ethyl acetate, or the like or by laser annealing, to phase separate the block copolymer 56 and form a phase separated block copolymer 58 as illustrated in FIG. 4. In an exemplary embodiment, the block copolymer 56 is heated at a predetermined temperature of from about 125 to about 350° C. for a predetermined time of from 1 minute to about 24 hours to form the phase separated block copolymer 58.

The phase separated block copolymer 58 has an etch resistant phase 60 and an etchable phase 62. Depending upon the particular block copolymer 56, the etchable phase 62 is formed from either the A polymer blocks or the B polymer blocks of the block copolymer 56 and the etch resistant phase 60 is formed from the other of the A polymer blocks or the B polymer blocks. In an exemplary embodiment, the block copolymer 56 is PS-b-PMMA and the etchable phase 62 is PMMA and the etch resistant phase 60 is PS. In an exemplary embodiment, the etchable phase 62 is the volume fraction minority phase of the block copolymer 56 (e.g., either the A polymer blocks or the B polymer blocks) and the etch resistant phase 60 is volume fraction majority phase of the block copolymer 42 (e.g., the other of the A polymer blocks or the B polymer blocks).

In an exemplary embodiment, the outer surfaces 64 of the graphoepitaxy DSA directing confinement well 46, whether defined by the etch layer 26 or optionally the orientation control layer 54, have different affinities towards the A polymer blocks and independently towards the B polymer blocks of the block copolymer 56. As such, when the block copolymer 56 phase separates, the etch resistant phase 60 and the etchable phase 62 are registered to the outer surfaces 64 that effectively act as a guide pattern so as to produce a nanopattern 66.

Figure 5:
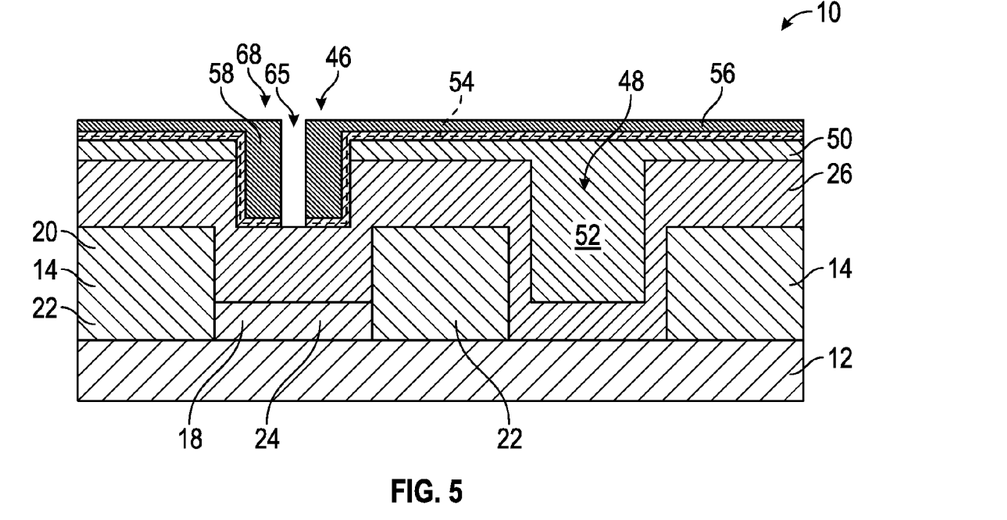
Figure 6:
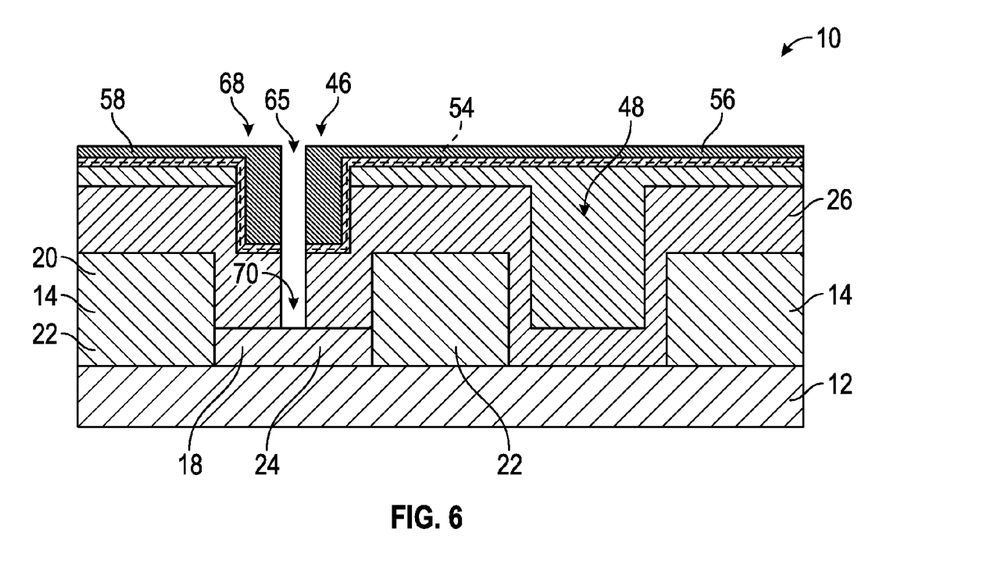

The method continues by removing the etchable phase 62 of the phase separated block copolymer 58 to form an opening 65 through the phase separated block copolymer 58 and define a nanopattern 66 as illustrated in FIG. 5. The remaining etch resistant phase 60 defines an etch mask 68 for transferring the nanopattern 66 to the etch layer 26. In an exemplary embodiment, the etchable phase 62 is removed by exposing the phase separated block copolymer 58 to a dry etching process, such as reactive-ion etching (RIE) plasma or exposure to deep ultraviolet light followed by solvent or acid wash. The nanopattern 66 is transferred to the etch layer 26 as illustrated in FIG. 6 to form an opening 70 that is aligned with the opening 65 in the etch mask 68. In an exemplary embodiment, the nanopattern 66 is transferred to the etch layer 26 using a conventional wet or dry etching process. The etch mask 68 can be removed and the opening 70 can be subsequently filled with a conductive fill (e.g., tungsten, copper or the like) using well-known techniques to form a conductive via or contact, for example, to form part of an interconnection with the corresponding device feature 14 (e.g., with the source and drain region 24 of the device feature 14).

Figure 7:
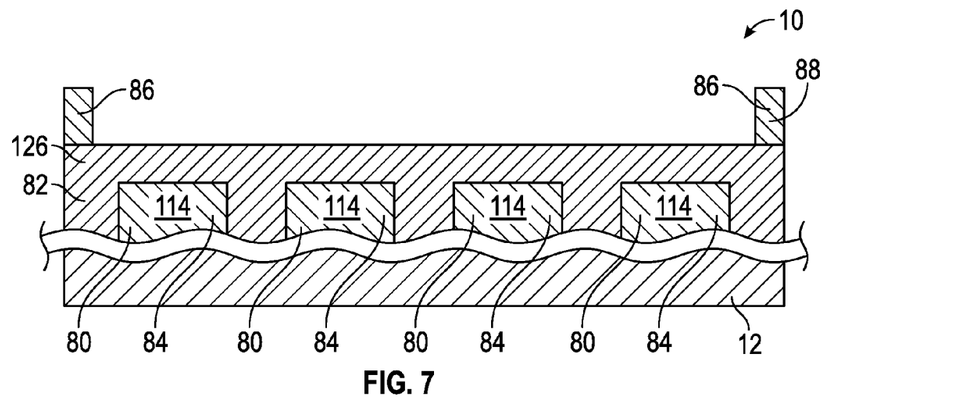

FIGS. 7-15 illustrate, in cross-sectional views, the integrated circuit 10 during various intermediate fabrication stages in accordance with another exemplary embodiment. Referring to FIG. 7, the IC 10 includes a semiconductor substrate 12 as described above in relation to FIGS. 1-6. Disposed over, on and/or in the semiconductor substrate 12 are features 114 that may be device features as described above to form a front-and-of-the-line ("FEOL") structure, or alternatively, may be metal interconnect wiring that forms part of a metallization layer above the semiconductor substrate 12 and that can be connected together with other metallization layers to form a back-end-of-the-line ("BEOL") interconnect structure. In an exemplary embodiment, the features 114 are metal lines 80 that are disposed in an etch layer 126 that is an interlayer dielectric (ILD) layer 82 of dielectric material.

The ILD layer 82 may be made up of a suitable dielectric material, such as silicon dioxide ($SiO_2$), carbon-doped oxide, organosilicate glass, or the like. In an exemplary embodiment, the ILD layer 82 is a dielectric material that includes silicon and oxygen, such as $SiO_2$ or SiCOH or a porous low-k material. In an exemplary embodiment, the ILD layer 82 may be relatively thick with a thickness, for example, of from about 200 to about 3000 nm.

The metal lines 80 are formed of a conductive metal fill 84 that may also include a conductive seed layer and a liner (not shown) such as tantalum, tantalum nitride, or the like as are well known in the art. An exemplary conductive metal fill 84 is a highly conductive material such as copper.

The illustrated portion of the IC 10 may be formed on the basis of well-known techniques. In an exemplary embodiment, the ILD layer 82 (e.g., ILD layer 82 may be multiple layers formed by multiple deposition steps) is formed by depositing a dielectric material such as $SiO_2$ or SiCOH that includes organic porogen overlying the semiconductor substrate 12. The dielectric material may be deposited using a CVD process and the dielectric material may be treated, for example with UV radiation, to out gas the organic porogen and form porosity in the ILD layer 82 to further lower the dielectric constant of the dielectric material. Next, the exemplary ILD layer 82 is patterned and etched using, for example, a dry etching process to form metal line trenches. The metal line trenches are then filled by depositing a liner-forming material(s) and the conductive metal fill 84 into the metal line trenches, such as by using a physical vapor deposition (PVD) process (or an atomic layer deposition (ALD) process) and an electrochemical plating (ECP) process, respectively, to form the metal lines 80. Any overburden of the conductive metal fill 84 and/or the liner-forming material(s) is removed by a chemical mechanical planarization (CMP) process. For reasons discussed in further detail below, a patterned photoresist/anti-reflective layer 86 is disposed overlying selected portions of the ILD layer 82 and is formed by depositing and patterning a photoresist layer 88 using conventional lithography techniques such as DUV, e-beam, or EUV.

Figure 8:
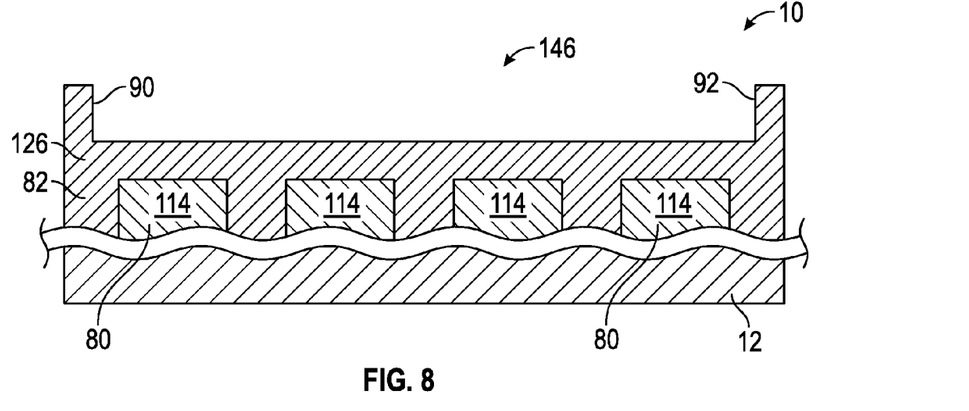

Referring to FIGS. 7-8, the method continues by using the patterned photoresist/anti-reflective layer 86 to partially etch into the ILD layer 82 using, for example, a dry etching process to form trenches for the next level of metal lines in the BOOL stack. In an exemplary embodiment, these trenches include sidewalls 90 and 92 in the ILD layer 82 that define a graphoepitaxy DSA directing confinement well 146. As illustrated, the graphoepitaxy DSA directing confinement well 146 is disposed directly over the metal lines 80, but separated electrically from them by a layer of dielectric.

Figure 9:
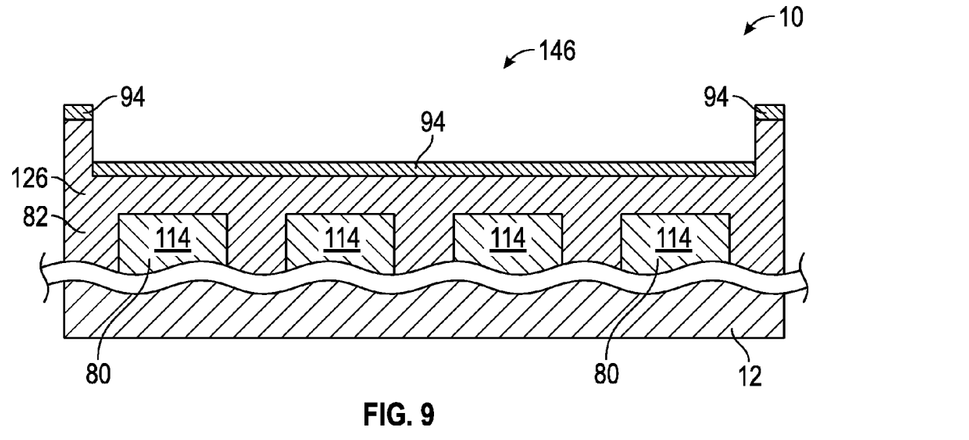

The patterned photoresist/anti-reflective layer 86 is then removed and a memorization layer 94 is deposited in the graphoepitaxy DSA directing confinement well 146 as illustrated in FIG. 9. The memorization layer 94 can be deposited so as to fully expose the sidewalls (as illustrated), partially cover the sidewalls, or fully cover the sidewalls. In particular, the memorization layer 94 is for recording ("memorization of") a nanopattern that will be subsequently defined by phase separating a block copolymer in the graphoepitaxy DSA directing confinement well 146 as will be discussed in further detail below for selective transfer of the nanopattern to the underlying ILD layer 82. In an exemplary embodiment, the memorization layer 94 is a thin layer of silicon dioxide ($SiO_2$) having a thickness of from about 5 to about 50 nm and is formed by depositing and decomposing a source material such as tetraethylorthosilicate (TEOS). Alternative materials and processes for forming the memorization layer 94 known to those skilled in the art may also be used, such as, for example, using an ALD or MLD process and forming the memorization layer 94 with a thickness of from about 1 to about 50 nm, wherein the memorization-forming material(s) can be dielectric or not, for example SiN, a high-k dielectric such as $HfO_2$, $TiO_2$, or alternatively can be TaN or TiN. Although not illustrated, additionally an orientation control layer such as the orientation control layer 54 illustrated in FIG. 2 can optionally be deposited overlying the memorization layer 94.

Figure 10:
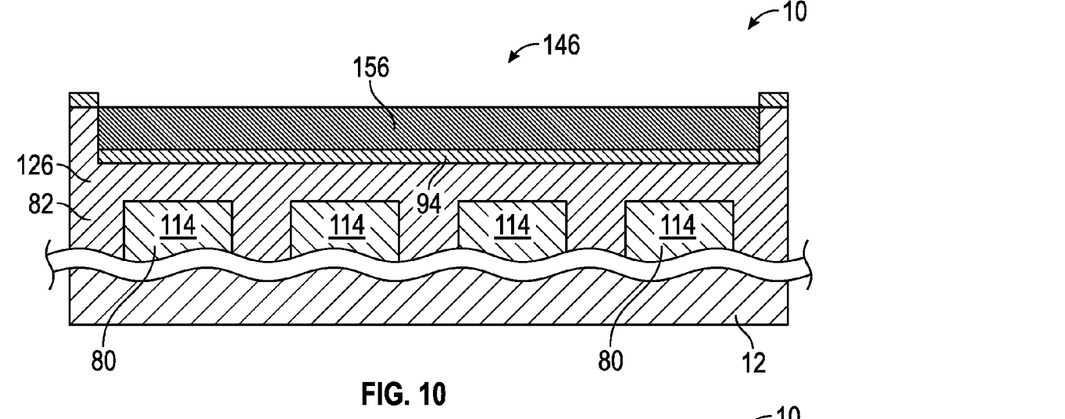

FIGS. 10-13 illustrate, in cross-sectional views, the IC 10 during later fabrication stages in accordance with an exemplary embodiment. The exemplary method continues by depositing a block copolymer 156 as discussed above overlying the memorization layer 94 and filling the graphoepitaxy DSA directing confinement well 146 as illustrated in FIG. 10.

Figure 11:
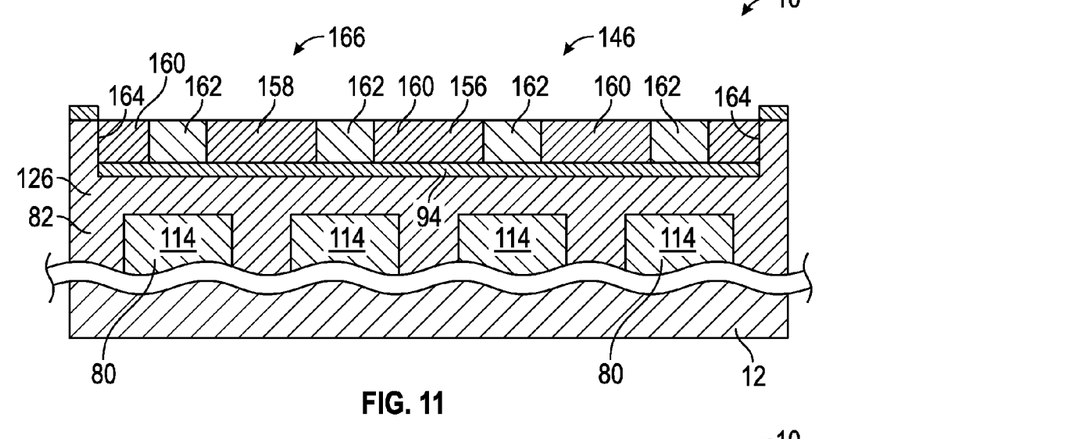

The block copolymer 156 is annealed, for example by either heating the block copolymer 156 at a predetermined temperature for a predetermined time or by applying an organic solvent such as methyl ethyl ketone (MEK), toluene, ethyl acetate, or the like to phase separate the block copolymer 156 and form a phase separated block copolymer 158 as illustrated in FIG. 11. In an exemplary embodiment, the block copolymer 156 is heated at a predetermined temperature of from about 125 to about 350° C. for a predetermined time of from 1 minute to about 24 hours to form the phase separated block copolymer 158.

The phase separated block copolymer 158 has an etch resistant phase 160 and an etchable phase 162. In an exemplary embodiment, the etch resistant phase 160 and the etchable phase 162 are registered to the outer surfaces 164 of the graphoepitaxy DSA directing confinement well 146 and/or the memorization layer 94 so as to produce a nanopattern 166.

Figure 12:
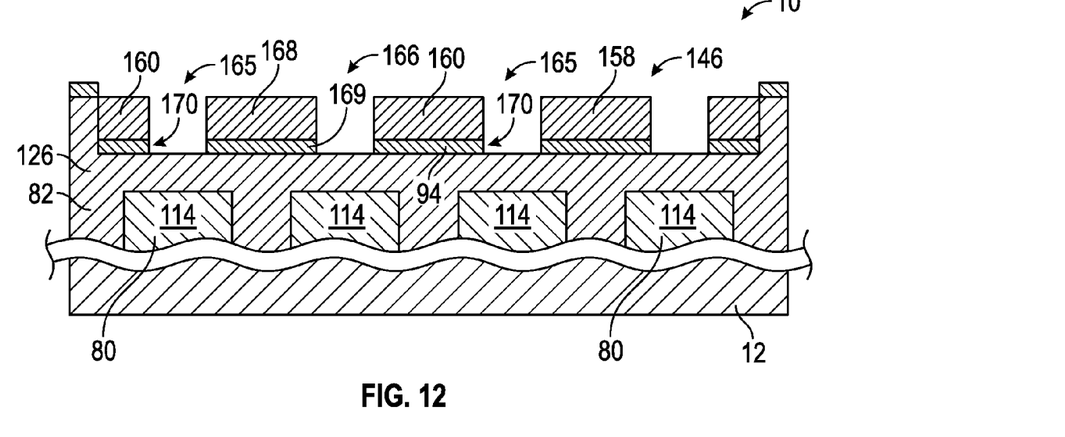

The exemplary method continues by removing the etchable phase 162 of the phase separated block copolymer 158 to form openings 165 through the phase separated block copolymer 158 as illustrated in FIG. 12. The remaining etch resistant phase 160 defines an etch mask 168 for transferring the nanopattern 166. In an exemplary embodiment, the etchable phase 162 is removed by exposing the phase separated block copolymer 158 to a dry etching process. The nanopattern 166 is transferred to the memorization layer 94 to form openings 170 that are correspondingly aligned with the openings 165 in the etch mask 168 to form in turn an etch mask 169. In an exemplary embodiment, the nanopattern 166 is transferred to the memorization layer 94 by removing exposed portions of the memorization layer 94 using a conventional wet or dry etching process.

Figure 13:
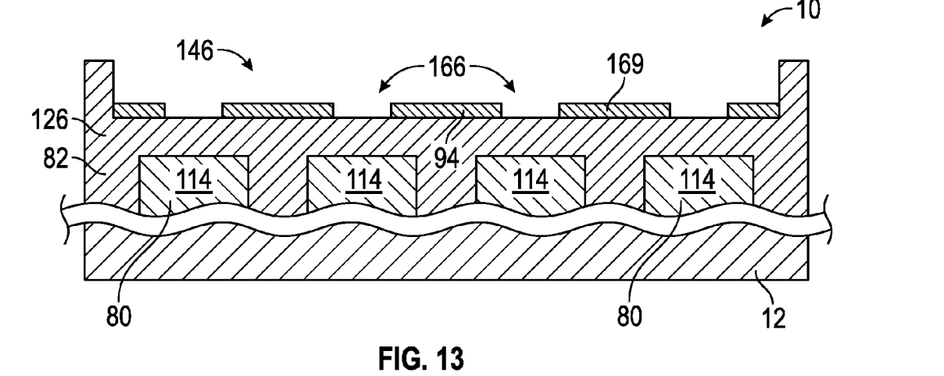
Figure 14:
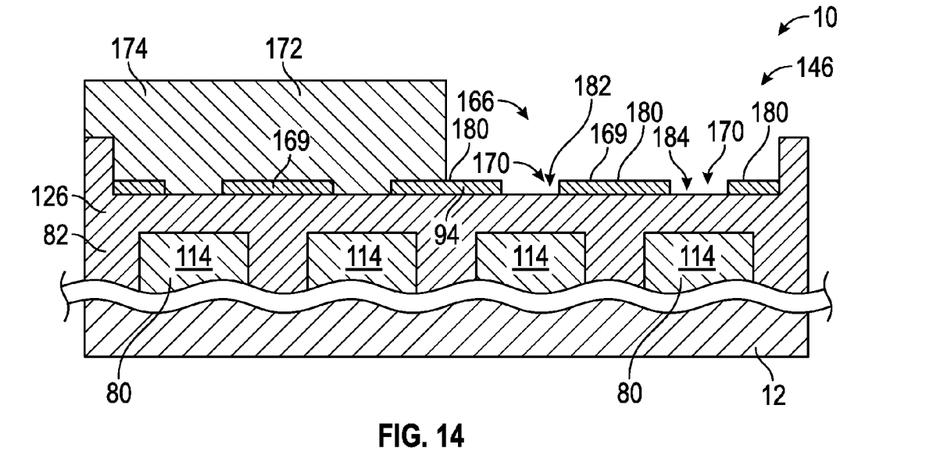
Figure 15:
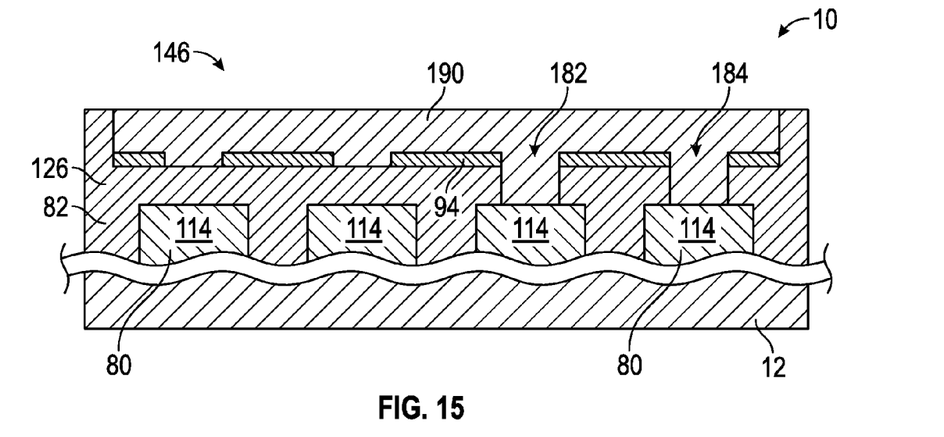

The exemplary method continues by removing the etch mask 168 while leaving the etch mask 169 formed in the memorization layer 94 substantially intact as illustrated in FIG. 13. In an exemplary embodiment and as illustrated in FIG. 14, selected portions of the nanopattern 166 are transferred to the ILD layer 82 by depositing and patterning a photoresist layer 172 to form a patterned photoresist layer 174 that covers a portion of the etch mask 169 to work as a "block mask." An exposed portion 180 of the etch mask 169 is then used to form openings 182 and 184 in the ILD layer 82 that are correspondingly aligned with openings 170 in the etch mask 169. In an exemplary embodiment, the selected portions of the nanopattern 166 are transferred to the ILD layer 82 using a conventional wet or dry etching process. As illustrated in FIG. 15, the openings 182 and 184 can be filled with a conductive fill 190 (e.g., copper or the like) to form, for example, conductive vias that correspondingly extend to the metal lines 80 by removing the patterned photoresist layer 174 and depositing a liner-forming material(s) and the conductive fill 190 in the graphoepitaxy DSA directing confinement well 146. Additionally, it is possible to strip the memorization layer 94 before metallization, or to leave the memorization layer 94 on the wafer as illustrated in FIG. 15.

Accordingly, methods for fabricating integrated circuits using graphoepitaxy DSA directing confinement wells for directed self-assembly have been described. In an exemplary embodiment, a method for fabricating an integrated circuit includes forming a graphoepitaxy DSA directing confinement well using a sidewall of an etch layer that overlies a semiconductor substrate. The graphoepitaxy DSA directing confinement well is filled with a block copolymer. The block copolymer is phase separated into an etchable phase and an etch resistant phase. The etchable phase is etched while leaving the etch resistant phase substantially in place to define an etch mask with a nanopattern. The nanopattern is transferred to the etch layer.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
   forming a graphoepitaxy DSA directing confinement well using a sidewall of an etch layer that overlies a semiconductor substrate, wherein forming the graphoepitaxy DSA directing confinement well comprises forming the sidewall in the etch layer by conformally depositing the etch layer over a device feature that has a vertical surface that defines at least in part a topography of the device feature such that the etch layer conforms to the topography of the device feature including the sidewall corresponding to the vertical surface;
   filling the graphoepitaxy DSA directing confinement well with a block copolymer;
   phase separating the block copolymer into an etchable phase and an etch resistant phase;
   etching the etchable phase while leaving the etch resistant phase substantially in place to define an etch mask with a nanopattern; and
   transferring the nanopattern to the etch layer.

2. The method of claim 1, further comprising:
   depositing an orientation control layer in the graphoepitaxy DSA directing confinement well, and wherein filling comprises depositing the block copolymer in the graphoepitaxy DSA directing confinement well overlying the orientation control layer.

3. The method of claim 1, wherein etching comprises removing at least a portion of the etchable phase while leaving the etch resistant phase substantially in place to form a first opening through the block copolymer in the graphoepitaxy DSA directing confinement well, thereby defining the etch mask.

4. The method of claim 3, wherein transferring comprises etching a second opening in the etch layer using the etch mask, and wherein the second opening is aligned with the first opening.

5. The method of claim 1, wherein filling comprises depositing the block copolymer having a volume fraction minority phase and a volume fraction majority phase.

6. The method of claim 5, wherein phase separating comprises phase separating the block copolymer into the volume fraction majority phase as the etch resistant phase.

7. The method of claim 5, wherein phase separating comprises phase separating the block copolymer into the volume fraction minority phase as the etchable phase.

8. A method for fabricating an integrated circuit comprising:
   conformally depositing an etch layer overlying a semiconductor substrate and a device feature that has a topography to form the etch layer with a sidewall that at least in part defines a graphoepitaxy DSA directing confinement well, wherein conformally depositing comprises conformally depositing the etch layer to form the etch layer with an additional sidewall that defines a trench that is spaced apart from the graphoepitaxy DSA directing confinement well;
   depositing and patterning a photoresist layer overlying the etch layer to form a patterned photoresist layer that exposes the graphoepitaxy DSA directing confinement well and fills the trench;
   depositing a block copolymer in the graphoepitaxy DSA directing confinement well, wherein depositing the block copolymer comprises depositing the block copolymer overlying the patterned photoresist layer and filling the graphoepitaxy DSA directing confinement well with the block copolymer;
   phase separating and etching the block copolymer to define a nanopattern; and
   transferring the nanopattern to the etch layer.

9. A method for fabricating an integrated circuit comprising:
   depositing an etch layer overlying a semiconductor substrate;
   etching a sidewall in the etch layer to define at least in part a graphoepitaxy DSA directing confinement well;
   depositing a memorization layer in the graphoepitaxy DSA directing confinement well;
   depositing a block copolymer in the graphoepitaxy DSA directing confinement well, wherein depositing the block copolymer comprises depositing the block copolymer in the graphoepitaxy DSA directing confinement well overlying the memorization layer;
   phase separating and etching the block copolymer to define a nanopattern, wherein phase separating and etching comprises:
      phase separating the block copolymer into an etchable phase and an etch resistant phase; and
      removing at least a portion of the etchable phase while leaving the etch resistant phase substantially in place to form one or more first openings through the block copolymer in the graphoepitaxy DSA directing confinement well, thereby defining a first etch mask with the nanopattern; and
   transferring the nanopattern to the etch layer, wherein transferring comprises etching one or more second openings in the memorization layer using the first etch mask to define a second etch mask, wherein the one or more second openings are correspondingly aligned with the one or more first openings, wherein transferring comprises etching one or more third openings in the etch layer using the second etch mask, wherein the one or more third openings are correspondingly aligned with the one or more second openings, and wherein the method further comprises removing the first etch mask prior to etching the one or more third openings in the etch layer.

10. The method of claim 9, further comprising depositing a conductive metal fill in the one or more third openings.

11. The method of claim 10, further comprising removing the second etch mask after forming the one or more third openings in the etch layer and prior to depositing the conductive metal fill.

12. The method of claim 9, wherein the one or more first openings includes a first opening and an additional first opening and the one or more second openings includes a second opening and an additional second opening, wherein transferring comprises:
  depositing and patterning a photoresist layer over the second etch mask to form a patterned photoresist layer that exposes the second opening and covers the additional second opening; and
  etching a third opening in the etch layer using the second etch mask and the patterned photoresist layer, wherein the third opening is aligned with the second opening.

13. The method of claim 9, wherein depositing the etch layer comprises depositing an interlayer dielectric (ILD) of dielectric material overlying a device feature or a metal line to form the etch layer.

* * * * *